United States Patent [19]
Dhong et al.

[11] Patent Number: 5,257,232
[45] Date of Patent: Oct. 26, 1993

[54] SENSING CIRCUIT FOR SEMICONDUCTOR MEMORY WITH LIMITED BITLINE VOLTAGE SWING

[75] Inventors: Sang H. Dhong, Mahopac, N.Y.; Koji Kitamura, Kusatsu, Japan; Toshiaki Kirihata, Yachiyo, Japan; Toshio Sunaga, Kusatsu, Japan

[73] Assignee: International Business Machines Corporation, Armonk, N.Y.

[21] Appl. No.: 847,769

[22] Filed: Mar. 5, 1992

[51] Int. Cl.$^5$ .................................................. G11C 13/00
[52] U.S. Cl. ..................................... 361/203; 365/226
[58] Field of Search ............... 365/203, 226, 227, 229, 365/182

[56] References Cited
U.S. PATENT DOCUMENTS
5,202,854 4/1993 Koike .................... 365/203

Primary Examiner—Terrell W. Fears
Attorney, Agent, or Firm—John J. Goodwin; Philip J. Feig

[57] ABSTRACT

A sensing circuit for dynamic random access memory is disclosed including a pair of bitlines precharged to a first voltage before sensing. A sense amplifier circuit is provided having one node thereof being connected to an external power supply via a switching means including pulsed sense clocks. Control means is provided and is connected to the switching means for controlling the switching means such that the voltage of the power supply is coupled to the node of the sense amplifier for activation for a predetermined period of time, thereby limiting the swing for the high-going bitline to a second voltage lower than said power supply voltage and higher than the first voltage. The reduced bit-line swings are achieved by means of the pulsed sense clocks and the pulse widths for sense clocks are determined by means of a reference bitlines connected to the control means.

5 Claims, 5 Drawing Sheets

SENSING CIRCUIT FOR SEMICONDUCTOR MEMORY WITH LIMITED BITLINE VOLTAGE SWING

BACKGROUND OF THE INVENTION

1. Field of the Invention

The present invention relates to sensing circuits for semiconductor memories, and more particularly to a sensing circuit including pulsed sensing clocks for limiting bitline voltage swings.

2. Background Art

No pertinent prior art is known. Background art to alternative technologies are as follows.

U.S. Pat. No. 4,816,706 issued Mar. 28, 1989 to Dhong et al entitled "SENSE AMPLIFIER WITH IMPROVED BITLINE PRECHARGING FOR DYNAMIC RANDOM ACCESS MEMORY" discloses a novel sense amplifier and decoupling device structure for integrated circuit memories wherein an embodiment of a cross-coupled sense amplifier includes two PMOS devices, the gates of which devices are grounded and clamp the downward voltage swing of the memory bitlines to the absolute value of the threshold voltage (VTP) of the grounded-gate PMOS devices in the sense amplifier. This limited voltage swing does not affect charge storage of storage capacitors because the absolute value of the threshold voltage (VT) of the cell transfer gate device is larger. Precharging the bitlines is achieved by equalizing the two bitlines, each charge to VDD and |VTP|, respectively. One node of the sense amplifier retains a full VDD swing and is conveniently connected to the DATA bus. The sense amplifier bitline swing is limited to a swing of VDD−|VTP| and saves power without adversely affecting charge storage and the precharging level.

The IBM Technical Disclosure Bulletin, Vol. 32, No. 10B, March 1990 on pages 427–429 includes a publication by K. S. Gray entitled "REDUCED VOLTAGE BITLINE RESTORE CIRCUIT" discloses a voltage reducing circuit for a semiconductor memory shown whereon the bitline pull-up voltage level may be less than the supply voltage VDD.

BRIEF SUMMARY OF THE INVENTION

An object of the present invention is to provide a high-speed and low-power sensing circuit for a submicron DRAM memory cell array. Another object of the present invention is to provide a sensing circuit including an internal voltage convertor on the chip to convert from the external voltage to the internal voltage to ensure the reliability on the cell array and the power reduction. A further object of the present invention is to provide a new pulsed sensing scheme that limits the swing for the high-going bitline voltage by using pulses sense clocks. Still another object of the present invention is to provide a sensing circuit for substantially faster but lower-power sensing while ensuring the device reliability on the cell array with low-noise.

DESCRIPTION OF THE PREFERRED EMBODIMENT

Figure 1:
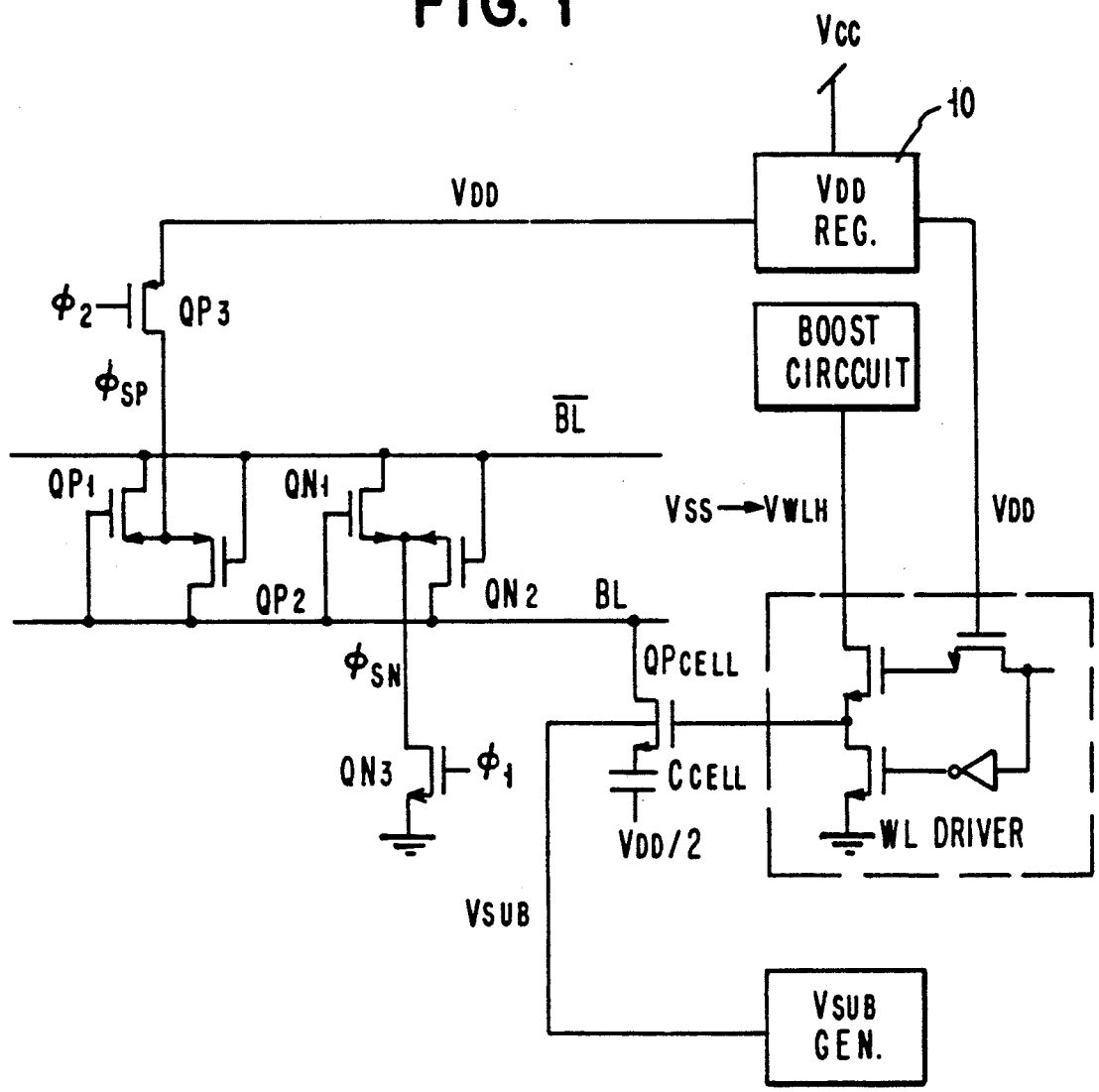
FIGS. 1 and 2 are schematic illustrations showing a conventional sensing circuit and associated waveforms.
Figure 2:
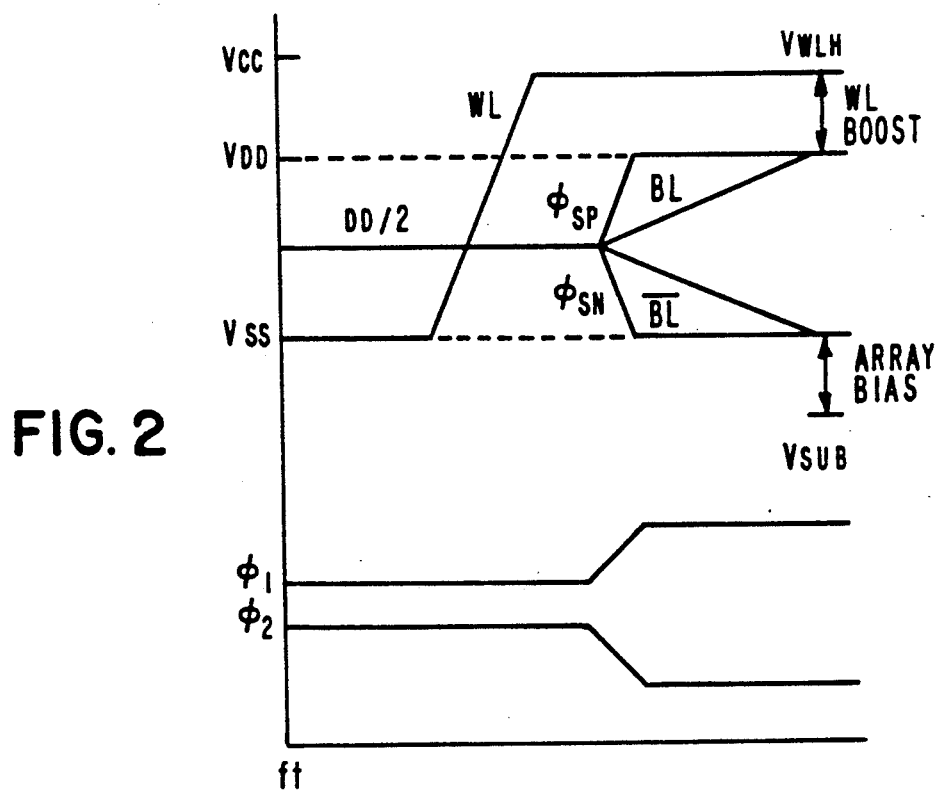

FIGS. 1 and 2 show schematic illustrations of a cross-section of a prior-art high-speed and low-power sensing structure for a semiconductor memory such as a submicron technology DRAM. The structure shown in FIG. 1 includes an internal voltage convertor 10 on the chip from an external voltage, VCC in the order of five volts, to the internal voltage, VDD of about 3.3 volts, to ensure the reliability of the cell array and the on-chip power reduction. FIG. 2 illustrates the waveforms of the signals in the structure of FIG. 1.

Figure 3:
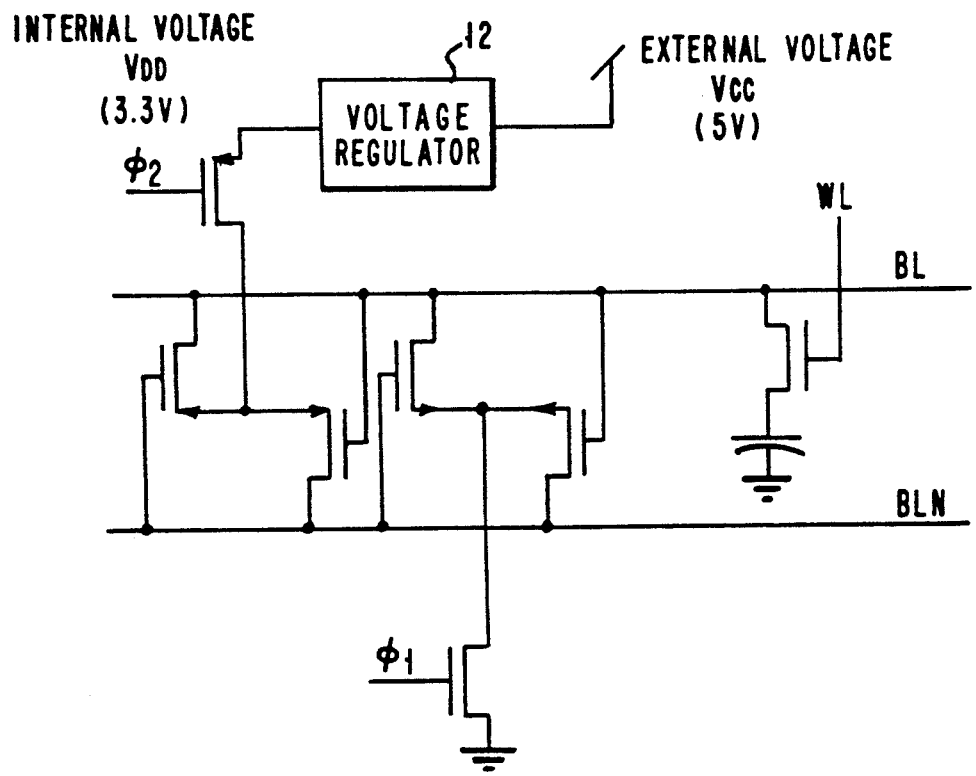
FIGS. 3 and 4 are schematic illustrations showing a prior-art sensing circuit and associated waveforms using pulsed-sensing technique.
Figure 4:
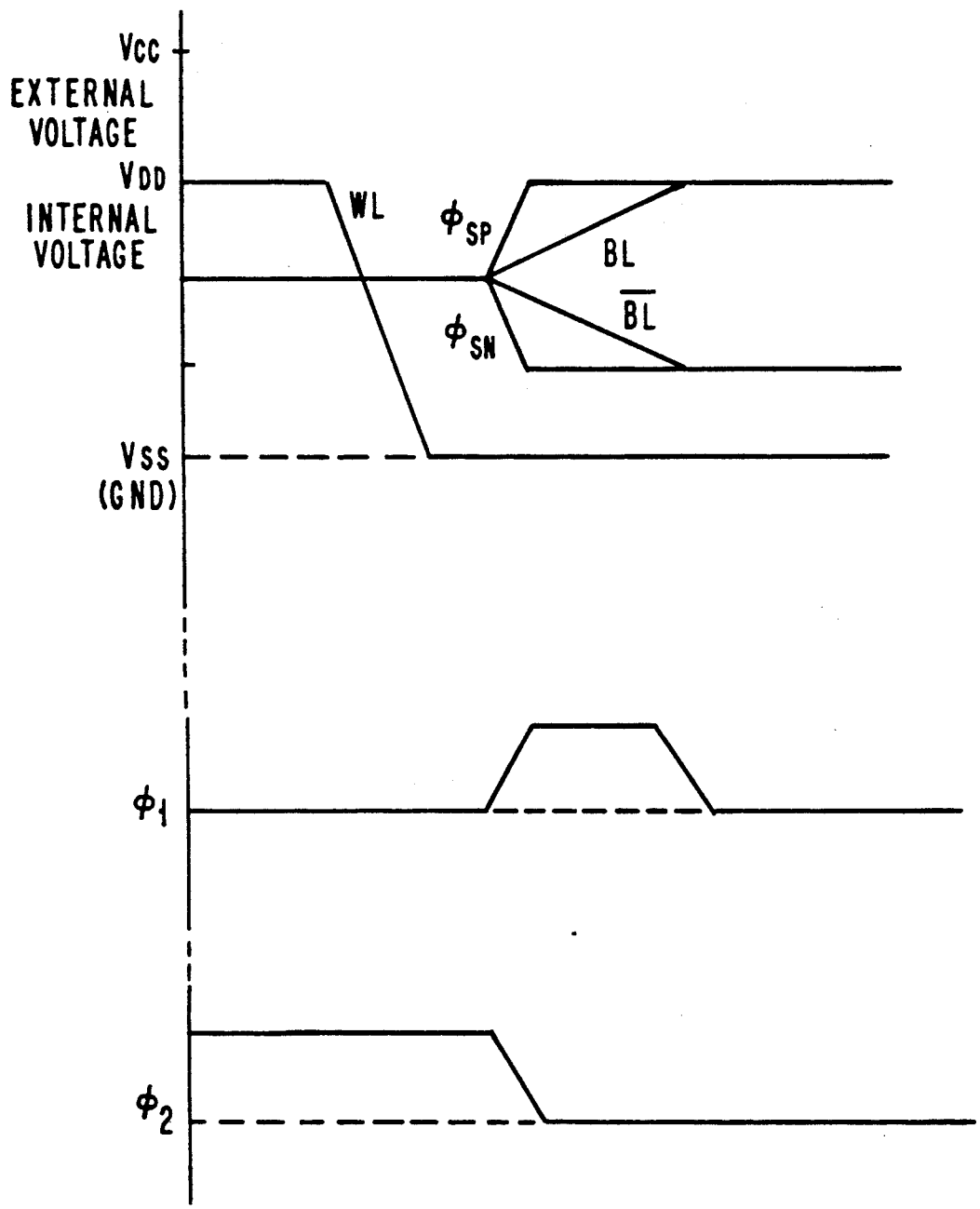

Another previously known technique, pulsed-sensing scheme is shown in FIGS. 3 and 4. FIG. 3 shows a pulsed sensing technique using a voltage regulator 12. FIG. 4 illustrates the waveforms of the signals of the structure of FIG. 3. As shown in the figures, the circuit limits the low-going bitline swing to the threshold voltage of Vtp on the PMOS pass gate by using a pulsed sense clock of $\Phi 1$. However, the high-going bitline is precharged to the internal voltage VDD by using a standard sense clock of $\Phi 2$. Accordingly, it does not ensure the device reliability on the cell array unless the external voltage of 5 V, VCC is reduced to the internal voltage of 3 V, VDD. Thus, an on-chip voltage regulator is needed as provided in FIG. 3.

Another disadvantage of the pulsed-sensing scheme is that the sensing speed becomes significantly slower because the cross-coupled PMOS pair operates from the internal voltage, VDD. Also the required regulator circuit significantly increases not only the design space but also increases the power dissipation in both the active and stand-by modes. The increased power dissipation not only makes the chip less competitive in low-power applications but also increases the noise on the VDD internal bus when the sensing starts. This could result in loss of stored cell charges but also could cause a CMOS latch-up in some cases.

Figure 5:
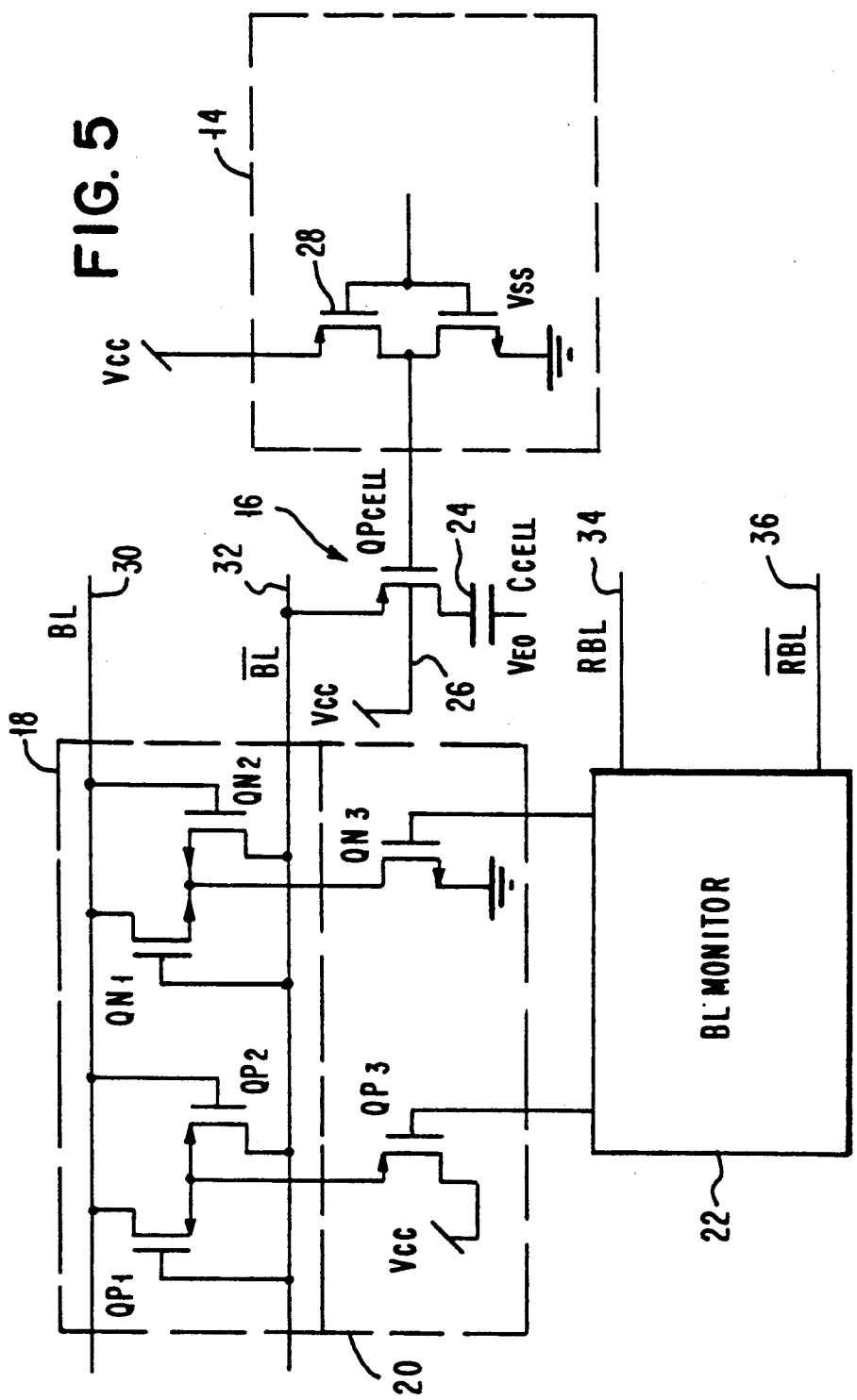
FIGS. 5 and 6 are schematic illustrations showing the new sensing circuit and associated waveforms using offset bitline architecture. The figures also show an external voltage source, a reference bitline voltage monitor, and pulsed sensing clocks.
Figure 6:
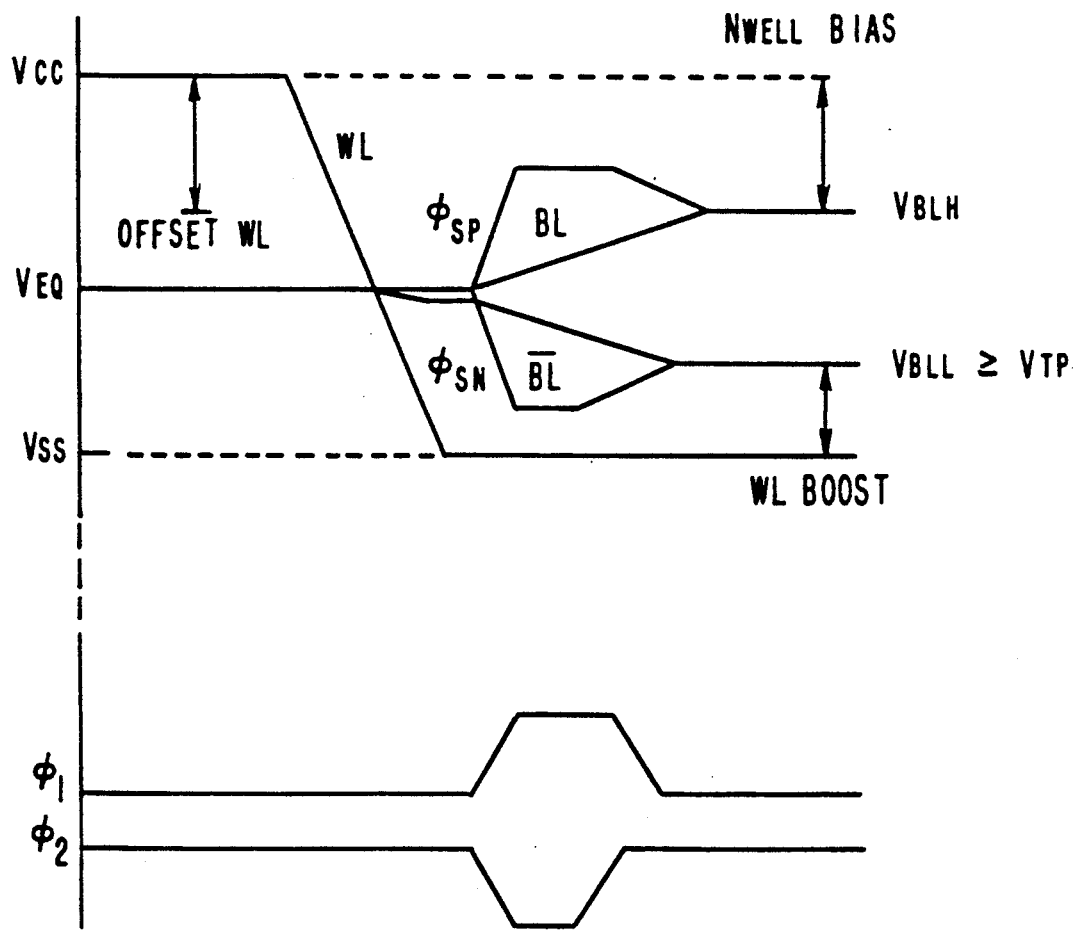

In the present invention shown schematically in FIGS. 5 and 6, a novel architecture is provided which solves these drawbacks without any on-chip voltage regulators and generators. FIG. 5 illustrates offset bitline circuit diagram for a CMOS DRAM memory array and FIG. 6 illustrates a timing chart for the circuit of FIG. 5. The architecture of FIG. 5, assuming a PMOS array DRAMS, uses an external voltage VCC for the memory array and its associated driver 14 without any voltage regulator and generator circuits. The concerns about the memory array reliability and its power dissipation are overcome by limiting the high-going and low-going bitline voltage swings to $V_{BH}$ and $V_{BLL}$ during sensing by means of pulsed sense clocks. This allows fast bitline sensing with low noise, because the required currents are directly supplied from the stable VCC and VSS bus lines. The offset voltage of $(V_{BLL}-V_{SS})$ provides a significant gate overdrive for a pass-gate without using a word-line boosting circuit. The offset voltage of $(V_{CC}-V_{BH})$, on the other hand, gives an either array-bias voltage or an offset word-line voltage, or both, without array bias and word-line high-voltage generators.

More detailed implementation can easily be understood by first noting the word-line driver, a PMOS cell array ($QP_{cell}$) 16 in an n-type well, a CMOS cross-coupled sense amplifier ($QP_1$, $QP_2$, $QN_1$, and $QN_2$) 18, its sense clock driver ($QP_3$ and $QN_3$) 20, and a bitline voltage monitor 22 in FIG. 5. The circuit uses external voltages of VCC and VSS for all the array circuits. The n-type well for the PMOS array is biased at VCC without any array bias generator. The n-type well biased by using VCC also provides a large decoupling capacitor 24 for the VCC bus line 26, resulting in a low-noise design. The word-line high voltage ($V_{WLH}$) in the stand-by phase is also pulled up to VCC by means of the PMOS transistor 28 in the WL driver. When the array is selected, one of the WLs rapidly falls to a word-line voltage ($V_{WLL}$) of VSS without any word-line boosting circuit. A simple CMOS word-line driver gives faster word-line transition than in the existing approach with the WL boosting circuit. Since the initial bitlines are precharged to a $V_{EQ}$ that is larger than the $QP_{cell}$ threshold of $V_{TP}$, the signal development is substantially faster than in conventional half-$V_{CC}$ sensing without WL boosting. The signal charges appearing on the bitline (BL) 30 from the access cells are, as a result, rapidly detected in the sense amplifier by pulsed sense clocks ($\phi_{SN}$ and $\phi_{SP}$). Since the currents necessary to charge the high-going BLs and discharge the low-going BLs are directly supplied from the VCC and VSS voltages, respectively, which make larger gate overdrives on the $QP_3$ and $QN_4$ devices, the sensing speed becomes very fast. The voltage swings for high-going and low-going reference bitlines (RBL 34 and $\overline{RBL}$ 36) are monitored in the BL voltage monitor 22. When the RBLs reach the target voltages ($V_{BLH}$ and $V_{BLL}$), $\phi_1$ and $\phi_2$ disable $\phi_{SP}$ and $\phi_{SN}$. This allows reduced voltage swings with respect to VCC and VSS for high-going and low-going BLs during sensing, and as a result, overcomes the array reliability concern. The reduced bitline voltage swings also contribute to a remarkable reduction in power. At the end of the cycle, BLs, RBLs, $\phi_{sp}$, and $\phi_{SN}$ are short-circuited and are naturally precharged to the equalized level of VEQ. This scheme, furthermore, provides symmetrical BL voltage swings for sensing, and as a result, the noise on the array is reduced. The plate for the PMOS cells (CELL) is biased at $V_{EQ}$, which decreases the gate dielectric field for both the stored "zero" and "one" data.

What has been described is an improved dynamic random access memory structure including a pair of bitlines precharged to a first voltage before sensing. A sense amplifier circuit is provided wherein one node thereof is connected to an external power supply via switching means and to means for controlling the switching means such that the voltage of the power supply is coupled to the aforesaid one node of said sense amplifier for activation for a predetermined period of time. This results in limiting the swing for the high-going bitline to a second voltage lower than the power supply voltage and higher than the first voltage. The array devices of the structure are protected by means of reduced bitline swings which swings are achieved by means of pulsed sense clocks. The pulse widths for the sense clocks are determined by means of a reference bitline voltage monitor. Other circuit features of the structure are that the offset voltage of ($V_{CC}-V_{BH}$) is used for array bias, the offset voltage of ($V_{CC}-V_{BH}$) is used for the offset word-line voltage, and the offset voltage of ($V_{BLL}-V_{SS}$) is used for word-line boosting voltage. Furthermore, the cell plate of the coupling capacitor is biased at $V_{EQ}$ and thus reduces the dielectric field for both the stored "zero" and "one" data.

As noted above, compared to the prior-art sensing techniques, the invention provides an array design for future scaling CMOS DRAMs that have dual-operating-voltage of VCC for the peripheral circuits, and VDD for the memory array, without requiring any regulator and generator circuits.

The reduced voltage swings for high-going and low-going bitlines during sensing embodied in the invention protect the memory array from a large electric field in external voltage supplies of VCC and VSS.

Also, further comparison of the invention to the prior art techniques provides the following additional advantages of the invention. The reduced voltage swings for high-going and low-going bitlines during sensing allow low-power sensing with low noise. The symmetrical voltage swings for high-going and low-going bitlines allow low-noise sensing. The array biased with VCC works as a large decoupling capacitor for the VCC bus line. The offset voltage between the VCC array and the reduced high-going bitline swing to $V_{BH}$ provides an array bias without any array bias generator. The offset voltage between the word-line high voltage of VCC and the reduced high-going bitline swing to $V_{BH}$ allows an off-set word-line architecture without any word-line high-voltage generator. The offset voltage between the word-line low voltage of VSS and the reduced low-going bitline swing to $V_{BLL}$ gives the word-line boosting voltage for the pass gate. The pulsed sense-clock driver working at VCC and VSS provides high-speed sensing. The pulsed sense-clock driver designed with VCC and VSS minimizes the sense noise, because the current necessary for the sensing is directly supplied from the stable VCC and VSS bus lines. The bitline voltage monitor achieves reduced bitline swings for high-going and low-going bitlines, and the cell plate biased at VEQ decreases the gate dielectric field for both the stored "zero" and "one" data.

Having thus described our invention, what we claim as new, and desire to secure by Letters Patent is:

1. A dynamic random access memory structure comprising:
   means for supplying a voltage VCC,
   a switching means having first and second sides, said first side of said switching means connected to said voltage supply means VCC,
   a first bitline having a first voltage level signal thereon, said first voltage level on said first bitline periodically swinging in a first, high going direction to a second high bit swing voltage level,
   a sense amplifier circuit connected to said first bitline, said sense amplifier including a node connected to said second side of said switching means and responsive to said voltage VCC from said voltage supply means when said switching means is activated,
   and control means connected to said switching means for selectively activating said switching means and connecting said voltage supply means VCC to said sense amplifier node for a given period of time for limiting the high going bit swing of said signal on said first bitline to a third voltage level $V_{BH}$ higher than said first voltage level and lower than said second high voltage level.

2. A dynamic random access memory structure according to claim 1 further including a second bitline, a pair of first and second reference bitlines, and wherein said sense amplifier circuit further includes first, second, third and fourth transistors connected to said first and second bitlines, said sense amplifier mode being connected between said first and second transistors, said switching means includes a sense clock driver circuit having two switching transistors connected to said sense amplifier circuit, and said control means includes a bitline monitor circuit connected to said sense clock driver circuit and to said pair of first and second reference bitlines.

3. A dynamic random access memory structure according to claim 2 further including a wordline driver circuit connected between said voltage supply source VCC and a second voltage level source VSS, and a cell array including a capacitor connected to a voltage VEQ and a transistor device connected to said capacitor, to second bitline, to said wordline driver circuit and to said first voltage level source VCC.

4. A dynamic random access memory structure according to claim 3 wherein said bitline voltage swing is limited for said given time period determined by pulse widths of said sense clocks of said switching means and wherein said pulse widths of sense clocks of said switching means are activated by signals on said first and second reference bitlines.

5. A dynamic random access memory structure according to claim 2 wherein said second bitline having a first voltage level thereon, said first voltage level on said second bitline, periodically swinging in second, low going direction to a second low going voltage level, and wherein said control means limits the low going bit swing of said signal on said second bitline to a third voltage level $V_{BLL}$ lower than said first voltage level are lower than said second, low voltage level.

* * * * *